(12) United States Patent
Chen et al.

(10) Patent No.: US 11,855,042 B2
(45) Date of Patent: Dec. 26, 2023

(54) METHOD OF MANUFACTURING SEMICONDUCTOR STRUCTURE

(71) Applicant: TAIWAN SEMICONDUCTOR MANUFACTURING COMPANY LTD., Hsinchu (TW)

(72) Inventors: Ming-Fa Chen, Taichung (TW); Wen-Chih Chiou, Miaoli County (TW); Sung-Feng Yeh, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 9 days.

(21) Appl. No.: 17/696,591

(22) Filed: Mar. 16, 2022

(65) Prior Publication Data

US 2022/0208725 A1 Jun. 30, 2022

Related U.S. Application Data

(63) Continuation of application No. 16/713,985, filed on Dec. 13, 2019, now Pat. No. 11,289,450, which is a
(Continued)

(51) Int. Cl.
*H01L 25/065* (2023.01)
*H01L 23/31* (2006.01)
(Continued)

(52) U.S. Cl.
CPC ........ *H01L 25/0655* (2013.01); *H01L 21/565* (2013.01); *H01L 23/3121* (2013.01); *H01L 23/3142* (2013.01); *H01L 23/481* (2013.01); *H01L 23/5386* (2013.01); *H01L 24/13* (2013.01); *H01L 24/16* (2013.01); *H01L 24/24* (2013.01); *H01L 24/73* (2013.01); *H01L 25/0652* (2013.01); *H01L 25/50* (2013.01); *H01L 23/3128* (2013.01); *H01L 24/32* (2013.01); *H01L 24/81* (2013.01); *H01L 24/92* (2013.01); *H01L 25/105* (2013.01);
(Continued)

(58) Field of Classification Search
CPC .............. H01L 25/0655; H01L 21/565; H01L 23/3121; H01L 23/3142; H01L 23/481; H01L 23/5386; H01L 24/13; H01L 24/16; H01L 24/24; H01L 24/73; H01L 25/0652; H01L 25/50; H01L 25/105; H01L 2224/18

See application file for complete search history.

(56) References Cited

U.S. PATENT DOCUMENTS

2015/0318246 A1* 11/2015 Yu ..................... H01L 21/76807
257/774

* cited by examiner

*Primary Examiner* — Samuel A Gebremariam
(74) *Attorney, Agent, or Firm* — WPAT LAW; Anthony King

(57) ABSTRACT

A method of manufacturing a semiconductor structure includes following operations. A substrate is provided. A first die is disposed over the substrate. A second die is provided. The second die includes a via extended within the second die. The second die is disposed over the substrate. A molding is formed around the first die and second die. An interconnect structure is formed. The interconnect structure includes a dielectric layer and a conductive member. The dielectric layer is disposed over the molding, the first die and the second die. The conductive member is surrounded by the dielectric layer. The via is formed by removing a portion of the second die to form a recess extended within the second die and disposing a conductive material into the recess.

20 Claims, 11 Drawing Sheets

Related U.S. Application Data continuation of application No. 15/688,574, filed on Aug. 28, 2017, now Pat. No. 10,510,718.

(51) Int. Cl.
*H01L 23/48* (2006.01)
*H01L 23/00* (2006.01)
*H01L 25/00* (2006.01)
*H01L 21/56* (2006.01)
*H01L 23/538* (2006.01)
*H01L 25/10* (2006.01)

(52) U.S. Cl.
CPC .............. *H01L 2224/0231* (2013.01); *H01L 2224/02379* (2013.01); *H01L 2224/13024* (2013.01); *H01L 2224/16227* (2013.01); *H01L 2224/18* (2013.01); *H01L 2224/24137* (2013.01); *H01L 2224/32225* (2013.01); *H01L 2224/73204* (2013.01); *H01L 2224/73259* (2013.01); *H01L 2224/80001* (2013.01); *H01L 2225/06541* (2013.01); *H01L 2225/06548* (2013.01); *H01L 2225/06565* (2013.01); *H01L 2924/15192* (2013.01)

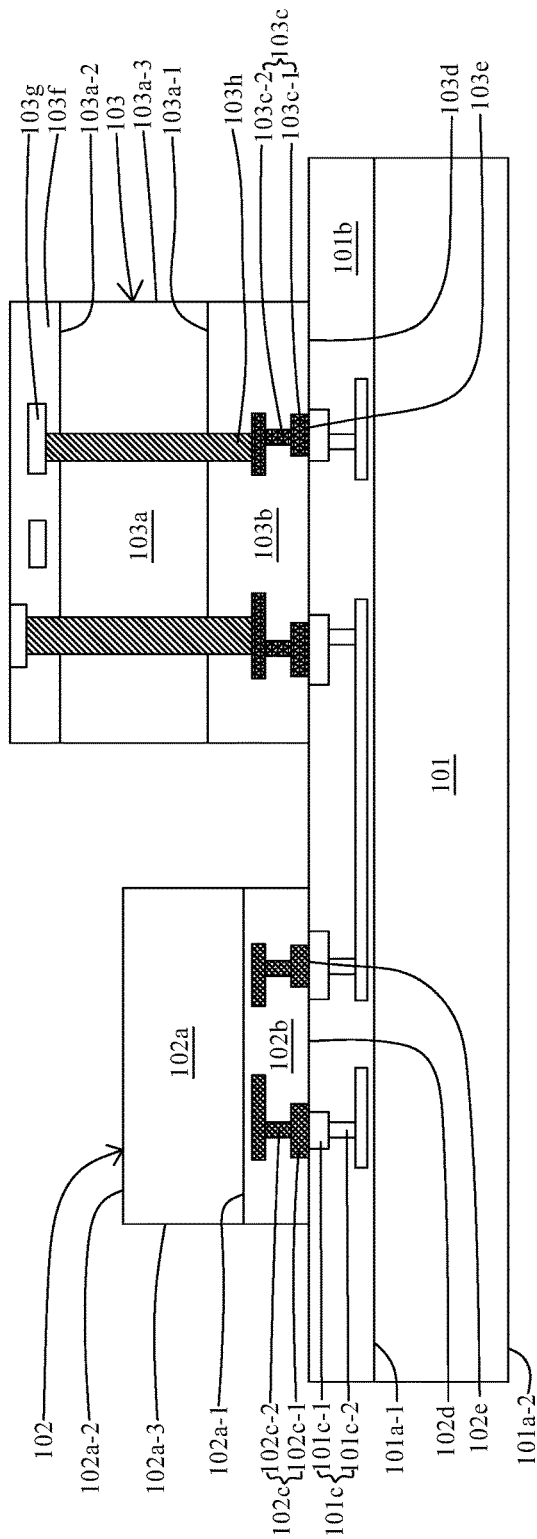
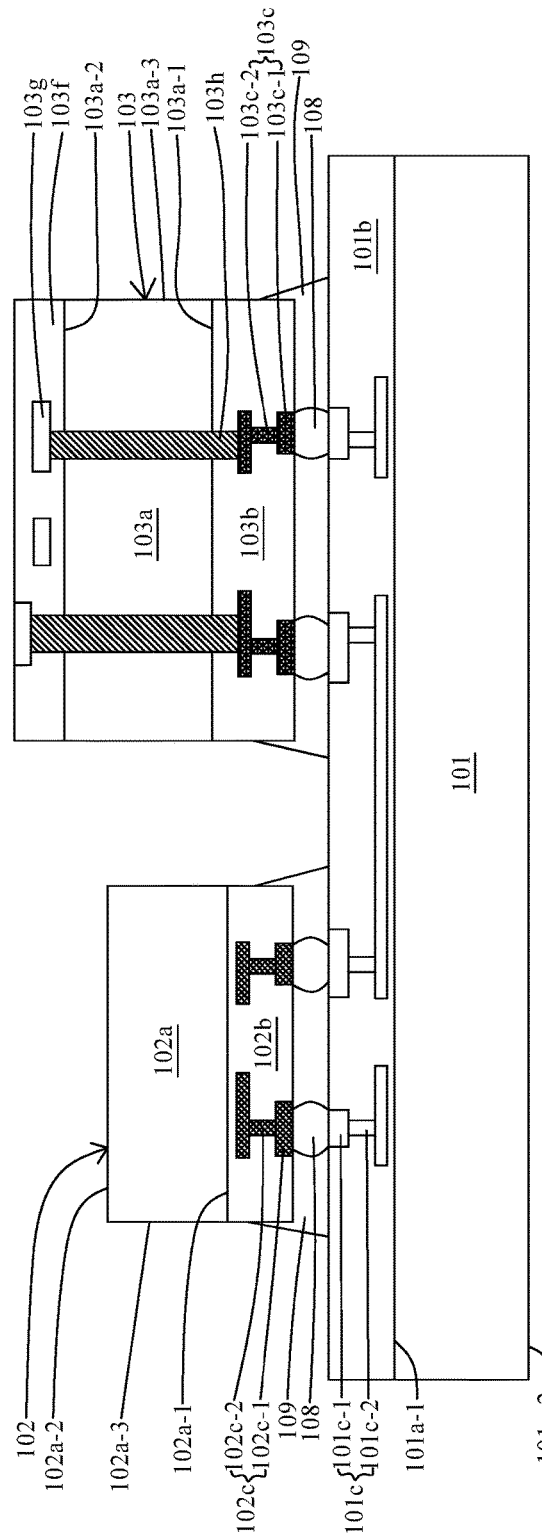
FIG. 5E
FIG. 5F

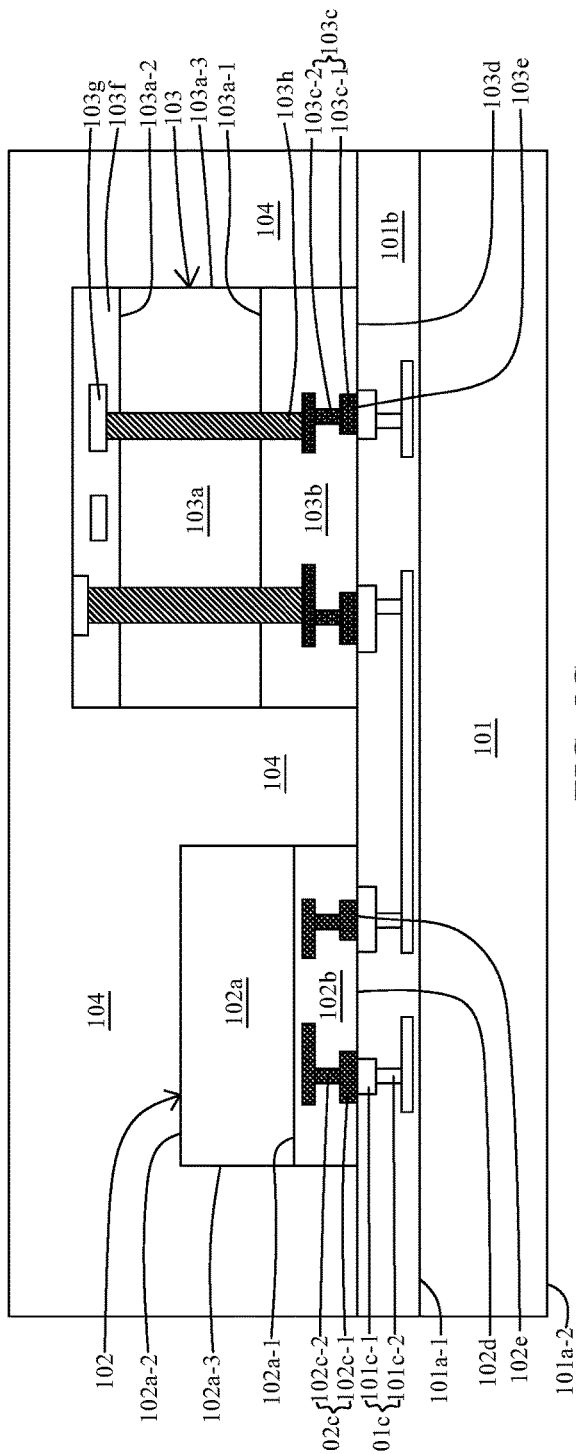
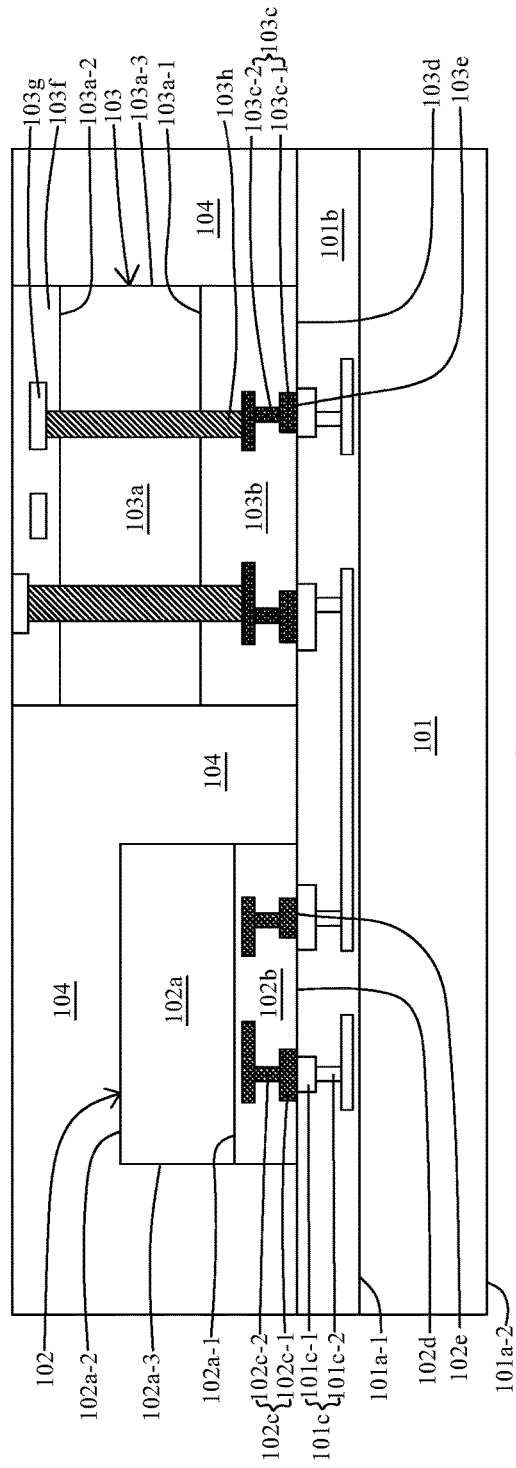
FIG. 5G
FIG. 5H

METHOD OF MANUFACTURING SEMICONDUCTOR STRUCTURE

CROSS REFERENCE TO RELATED APPLICATIONS

This application is a continuation of U.S. patent application Ser. No. 16/713,985, entitled "SEMICONDUCTOR STRUCTURE AND MANUFACTURING METHOD THEREOF" filed on Dec. 13, 2019, which is a continuation of U.S. patent Ser. No. 15/688,574, entitled "SEMICONDUCTOR STRUCTURE AND MANUFACTURING METHOD THEREOF" filed on Aug. 28, 2017; each of these applications are incorporated herein by reference in their entireties.

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a chip on wafer (CoW) is widely used to integrate several chips into a single semiconductor device. During the CoW operation, a number of chips are assembled on a single semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor electrical interconnection, delamination of components, or other issues, resulting in a high yield loss of the semiconductor device and increase of manufacturing cost. As such, there are many challenges for modifying a structure of the semiconductor devices and improving the manufacturing operations.

BRIEF DESCRIPTION OF THE DRAWINGS

Aspects of the present disclosure are best to from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 5A-5J are schematic views of manufacturing a semiconductor structure by a method of FIG. 4 in accordance with some embodiments of the present disclosure.

DETAILED DESCRIPTION OF THE DISCLOSURE

Figure 1:
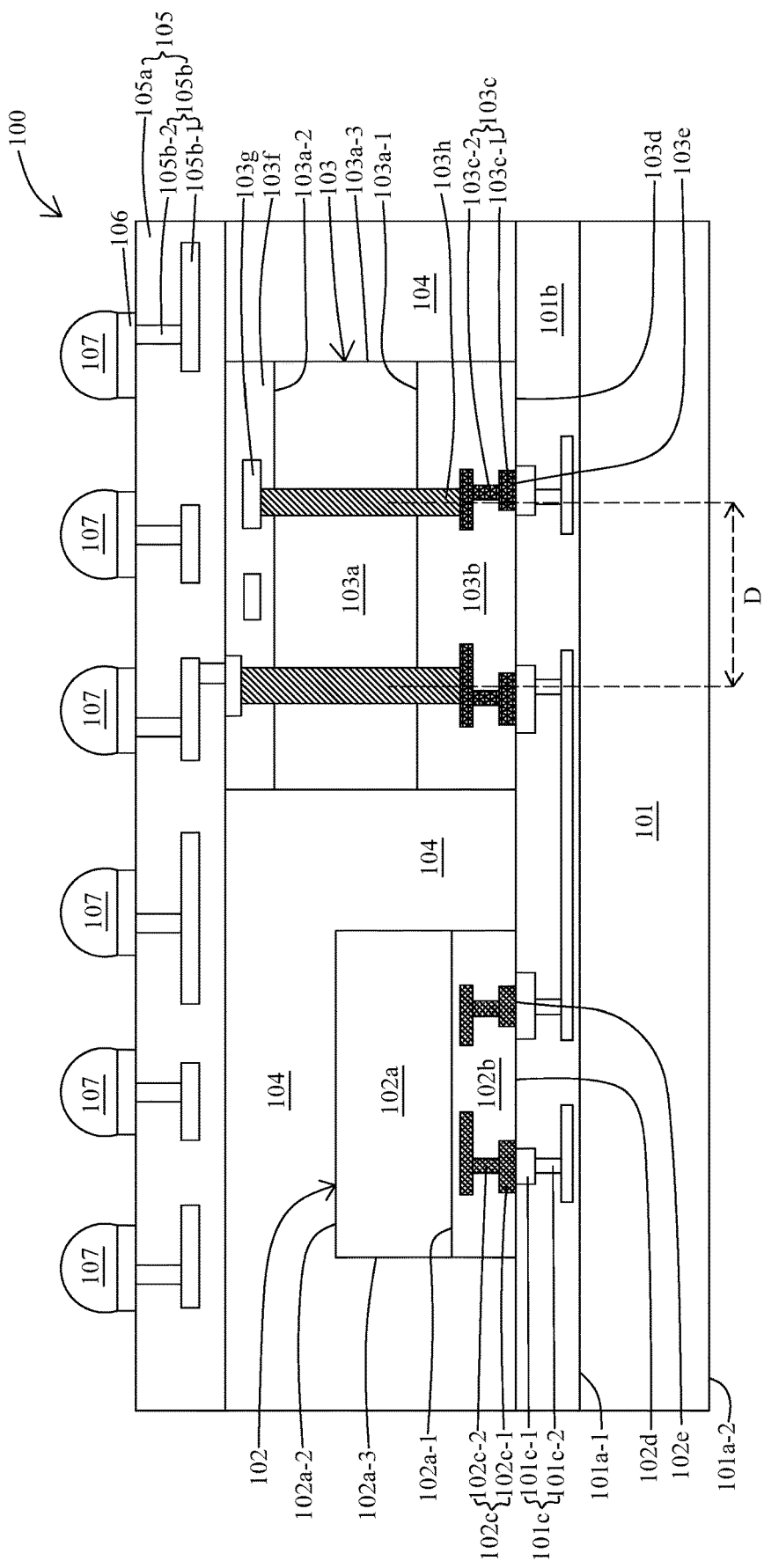
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected". "Coupled" and "connected" may also be used to indicate that two or more elements cooperate or interact with each other.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A semiconductor structure is manufactured by a number of operations. During manufacturing of the semiconductor structure, semiconductor chips with different functionalities and dimensions are integrated into a single module. The semiconductor chips are disposed on a substrate or wafer, and a molding is formed to encapsulate the semiconductor chips, and then several connectors are disposed on the molding and the semiconductor chips to electrically connect the substrate and the semiconductor chips with external circuitry. The semiconductor chips and the substrate are electrically communicable with the external circuitry through several vias (e.g. through molding via (TMV), through integrated circuit via (TIV), etc.) formed within the molding. However, the semiconductor structure in such configuration has large form factor, large pitch between vias (e.g. greater than 200 um), and small I/O counts, which are undesirable and may not meet demand.

In the present disclosure, a semiconductor structure is disclosed. The semiconductor structure includes a substrate, a first die disposed on the substrate, a second die disposed on the substrate, several vias extended within the second die, a molding disposed on the substrate and surrounding the first die and the second die, an interconnect structure disposed over the molding, the first die and the second die, and a conductive bump disposed over the interconnect structure. The substrate and the first die are electrically connected with the RDL and the conductive bump through the vias. The vias in the second die can be configured in small pitch (e.g. less than 10 um) As such, a number of I/O terminals can be increased, an overall dimension of the semiconductor structure can be reduced or minimized, and electrical performance of the semiconductor structure can be enhanced.

FIG. 1 is a schematic cross sectional view of a semiconductor structure 100 in accordance with various embodiments of the present disclosure. In some embodiments, the semiconductor structure 100 includes a substrate 101, a first die 102, a second die 103, a molding 104, an interconnect structure 105 and a first conductive bump 107.

In some embodiments, the semiconductor structure 100 is a semiconductor package. In some embodiments, the semiconductor structure 100 is an integrated fan out (InFO) package, where I/O terminals of the first die 102 or the second die 103 are fanned out and redistributed over a surface of the first die 102 or the second die 103 in a greater area. In some embodiments, the semiconductor structure 100 is a three dimensional integrated circuit (3D IC). In some embodiments, the semiconductor structure 100 is a chip on wafer (CoW) structure. In some embodiments, the semiconductor structure 100 is a system in package (SiP) structure.

In some embodiments, the substrate 101 is a semiconductive substrate. In some embodiments, the substrate 101 is a carrier, a wafer, an interposer or the like. In some embodiments, the substrate 101 is a silicon wafer or silicon interposer. In some embodiments, the substrate 101 includes semiconductive material such as silicon, germanium, gallium, arsenic, or combinations thereof. In some embodiments, the substrate 101 includes material such as ceramic, glass, polymer or the like. In some embodiments, the substrate 101 includes organic material. In some embodiments, the substrate 101 is fabricated with a predetermined functional circuit thereon. In some embodiments, the substrate 101 includes several conductive traces and several electrical components such as transistor, diode, etc. disposed within the substrate 101. In some embodiments, the substrate 101 includes application processor (AP). In some embodiments, the substrate 101 has a quadrilateral, rectangular, square, polygonal or any other suitable shape.

In some embodiments, the substrate 101 includes a first surface 101a-1 and a second surface 101a-2 opposite to the first surface 101a-1. In some embodiments, the first surface 101a-1 is a front side of the substrate 101, and the second surface 101a-2 is a back side of the substrate 101. In some embodiments, the first surface 101a-1 is an active side that several electrical components are disposed thereon. In some embodiments, the second surface 101a-2 is an inactive side that electrical component disposed thereon is absent.

In some embodiments, a substrate dielectric layer 101b is disposed over or on the substrate 101. In some embodiments, the substrate dielectric layer 101b is disposed over the first surface 101a-1 of the substrate 101. In some embodiments, the substrate dielectric layer 101b includes several layers of dielectric material stacking over each other. In some embodiments, the substrate dielectric layer 101b includes dielectric material such as silicon oxide, silicon nitride, undoped silicon glass or the like. In some embodiments, the substrate dielectric layer 101b includes polymeric material. In some embodiments, the substrate dielectric layer 101b includes polyimide (PI), polybenzoxazole (PBO) or the like.

In some embodiments, a substrate conductive member 101c is disposed over the substrate 101 and surrounded by the substrate dielectric layer 101b. In some embodiments, the substrate conductive member 101c is disposed within or over the substrate dielectric layer 101b. In some embodiments, the substrate conductive member 101c extends within the substrate dielectric layer 101b. In some embodiments, the substrate conductive member 101c extends through one or more layers of the substrate dielectric layer 101b. In some embodiments, the substrate conductive member 101c includes conductive material such as gold, silver, copper, nickel, tungsten, aluminum, tin and/or alloys thereof.

In some embodiments, the substrate conductive member 101c includes a substrate land portion 101c-1 and a substrate via portion 101c-2 extended from and coupled with the substrate land portion 101c-1. In some embodiments, the substrate land portion 101c-1 is laterally extended within or over the substrate dielectric layer 101b. In some embodiments, the substrate via portion 101c-2 is vertically extended within the substrate dielectric layer 101b and passes through at least one layer of the substrate dielectric layer 101b. In some embodiments, the substrate land portion 101c-1 and the substrate via portion 101c-2 are stacked over each other. In some embodiments, the substrate land portion 101c-1 and the substrate via portion 101c-2 are stacked alternately.

In some embodiments, the substrate land portion 101c-1 is disposed over the substrate dielectric layer 101b. In some embodiments, the substrate land portion 101c-1 is at least partially exposed from the substrate dielectric layer 101b. In some embodiments, the substrate land portion 101c-1 is a bonding pad for receiving, bonding with or electrically connecting with a conductive structure or a circuitry.

In some embodiments, the first die 102 is disposed over or on the substrate 101. In some embodiments, the first die 102 is disposed over or on the first surface 101a-1 of the substrate 101. In some embodiments, the first die 102 is disposed over or on the substrate dielectric layer 101b. In some embodiments, the first die 102 is fabricated with a predetermined functional circuit within the first die 102. In some embodiments, the first die 102 is singulated from a semiconductive wafer by a mechanical or laser blade. In some embodiments, the first die 102 comprises a variety of electrical circuits suitable for a particular application. In some embodiments, the electrical circuits include various devices such as transistors, capacitors, resistors, diodes and/or the like.

In some embodiments, the first die 102 is a logic device die, graphics processing unit (GPU) die, application processing (AP) die, memory die, dynamic random access memory (DRAM) die, high bandwidth memory (HBM) die or the like. In some embodiments, the first die 102 is a chip or a package. In some embodiments, the first die 102 has a top cross section (a cross section from the top view of the semiconductor structure 100 as shown in FIG. 1) in a quadrilateral, a rectangular or a square shape.

In some embodiments, the first die 102 includes a first die substrate 102a, a first dielectric layer 102b disposed between the first die substrate 102a and the substrate 101, and a first conductive member 102c surrounded by the first dielectric layer 102b. In some embodiments, the first die substrate 102a includes semiconductive materials such as silicon or other suitable materials. In some embodiments, the first die substrate 102a is a silicon substrate. In some embodiments, the first die substrate 102a includes several circuitries and one or more active elements such as transistors etc. disposed over or in the first die substrate 102a. In some embodiments, the first die substrate 102a includes a third surface 102a-1, a fourth surface 102a-2 opposite to the third surface 102a-1 and a sidewall 102a-3 substantially orthogonal to the third surface 102a-1 and the fourth surface 102a-2. In some embodiments, the third surface 102a-1 is an active side that several electrical components are disposed thereon. In some embodiments, the fourth surface 102a-2 is an inactive side that electrical component disposed thereon is absent.

In some embodiments, the first dielectric layer 102b is disposed between the first die substrate 102a and the substrate 101. In some embodiments, the first dielectric layer 102b is disposed below the first die substrate 102a. In some embodiments, the first dielectric layer 102b is disposed on the substrate dielectric layer 101b. In some embodiments, the first dielectric layer 102b is in contact with the substrate dielectric layer 101b. In some embodiments, the first dielectric layer 102b includes several layers of dielectric material stacking over each other.

In some embodiments, a first interface 102d is disposed between the substrate dielectric layer 101b and the first dielectric layer 102b. In some embodiments, the first interface 102d is horizontally extended. In some embodiments, the first interface 102d is substantially parallel to the third surface 102a-1 and the fourth surface 102a-2 and is substantially orthogonal to the sidewall 102a-3 of the first die 102. In some embodiments, the first dielectric layer 102b includes dielectric material such as silicon oxide, silicon nitride, undoped silicon glass or the like. In some embodiments, the first dielectric layer 102b includes polymeric material. In some embodiments, the first dielectric layer 102b includes polyimide (PI), polybenzoxazole (PBO) or the like.

In some embodiments, the first conductive member 102c is surrounded by the first dielectric, layer 102b. In some embodiments, the first conductive member 102c is disposed within or over the first dielectric layer 102b. In some embodiments, the first conductive member 102c extends within the first dielectric layer 102b. In some embodiments, the first conductive member 102c extends through one or more layers of the first dielectric layer 102b. In some embodiments, the first conductive member 102c is configured to route a path of circuitry from the first die substrate 102a and redistribute I/O terminals of the first die substrate 102a. In some embodiments, the first conductive member 102c is configured to electrically connect the first die 102 with a circuitry or conductive structure external to the first die 102. In some embodiments, the first conductive member 102c is electrically connected with the substrate conductive member 101c. In some embodiments, the first conductive member 102c is disposed on and bonded with the substrate conductive member 101c, such that the first die 102 is electrically connected to the substrate 101.

In some embodiments, a second interface 102e is disposed between the substrate conductive member 101c and the first conductive member 102c. In some embodiments, the second interface 102e is horizontally extended. In some embodiments, the second interface 102e is substantially parallel to the third surface 102a-1 and the fourth surface 102a-2 and is substantially orthogonal to the sidewall 102a-3 of the first die 102. In some embodiments, the first conductive member 102c includes conductive material such as gold, silver, copper, nickel, tungsten, aluminum, tin and/or alloys thereof.

In some embodiments, the first conductive member 102c includes a first land portion 102c-1 and a first via portion 102c-2 extended from and coupled with the first land portion 102c-1. In some embodiments, the first land portion 102c-1 is laterally extended within or over the first dielectric layer 102b. In some embodiments, the first via portion 102c-2 is vertically extended within the first dielectric layer 102b and passes through at least one layer of the first dielectric layer 102b. In some embodiments, the first land portion 102c-1 and the first via portion 102c-2 are stacked over each other. In some embodiments, the first land portion 102c-1 and the first via portion 102c-2 are stacked alternately.

In some embodiments, the first land portion 102c-1 is disposed over the first dielectric layer 102b. In some embodiments, the first land portion 102c-1 is at least partially exposed from the first dielectric layer 102b. In some embodiments, the first land portion 102c-1 is a bonding pad for receiving, bonding with or electrically connecting with a conductive structure or a circuitry. In some embodiments, the first land portion 102c-1 is disposed on and bonded with the substrate land portion 101c-1.

In some embodiments, the second die 103 is disposed over or on the substrate 101. In some embodiments, the second die 103 is disposed over or on the first surface 101a-1 of the substrate 101. In some embodiments, the second die 103 is disposed over or on the substrate dielectric layer 101b. In some embodiments, the second die 103 is fabricated with a predetermined functional circuit within the second die 103. In some embodiments, the second die 103 is singulated from a semiconductive wafer by a mechanical or laser blade. In some embodiments, the second die 103 comprises a variety of electrical circuits suitable for a particular application. In some embodiments, the electrical circuits include various devices such as transistors, capacitors, resistors, diodes and/or the like. In some embodiments, the second die 103 is a functional die.

In some embodiments, the first die 102 is a logic device die, graphics processing unit (GPU) die, application processing (AP) die, memory die, dynamic random access memory (DRAM) die, high bandwidth memory (HBM) die or the like. In some embodiments, the second die 103 is a chip or a package. In some embodiments, the second die 103 is a dummy die. In some embodiments, the second die 103 has a top cross section (a cross section from the top view of the semiconductor structure 100 as shown in FIG. 1) in a quadrilateral, a rectangular or a square shape. In some embodiments, a thickness of the first die 102 is substantially different from or same as a thickness of the second die 103.

In some embodiments, the second die 103 includes a second die substrate 103a, a second dielectric layer 103b disposed between the second die substrate 103a and the substrate 101, and a second conductive member 103c surrounded by the second dielectric layer 103b. In some embodiments, the second die substrate 103a includes semiconductive materials such as silicon or other suitable materials. In some embodiments, the second die substrate 103a is a silicon substrate. In some embodiments, the second die substrate 103a includes several circuitries and one or more active elements such as transistors etc. disposed over or in the second die substrate 103a. In some embodiments, the second die substrate 103a includes a fifth surface 103a-1, a sixth surface 103a-2 opposite to the fifth surface 103a-1 and a sidewall 103a-3 substantially orthogonal to the fifth surface 103a-1 and the sixth surface 103a-2. In some embodiments, the fifth surface 103a-1 is an active side that several electrical components are disposed thereon. In some embodiments, the sixth surface 103a-2 is an inactive side that electrical component disposed thereon is absent.

In some embodiments, the second dielectric layer 103b is disposed between the second die substrate 103a and the substrate 101. In some embodiments, the second dielectric layer 103b is disposed below the second die substrate 103a. In some embodiments, the second dielectric layer 103b is disposed on the substrate dielectric layer 101b. In some embodiments, the second dielectric layer 103b is in contact with the substrate dielectric layer 101b. In some embodiments, the second dielectric layer 103b includes several layers of dielectric material stacking over each other.

In some embodiments, a third interface 103d is disposed between the substrate dielectric layer 101b and the second dielectric layer 103b. In some embodiments, the third interface 103d is horizontally extended. In some embodiments, the third interface 103d is substantially parallel to the fifth surface 103a-1 and the sixth surface 103a-2 and is substantially orthogonal to the sidewall 103a-3 of the second die 103. In some embodiments, the second dielectric layer 103b includes dielectric material such as silicon oxide, silicon nitride, undoped silicon glass or the like. In some embodiments, the second dielectric layer 103b includes polymeric material. In some embodiments, the second dielectric layer 103b includes polyimide (PI), polybenzoxazole (PBO) or the like.

In some embodiments, the second conductive member 103c is surrounded by the second dielectric layer 103b. In some embodiments, the second conductive member 103c is disposed within or over the second dielectric layer 103b. In some embodiments, the second conductive member 103c extends within the second dielectric layer 103b. In some embodiments, the second conductive member 103c extends through one or more layers of the second dielectric layer 103b. In some embodiments, the second conductive member 103c is configured to route a path of circuitry from the second die substrate 103a and redistribute I/O terminals of the second die substrate 103a. In some embodiments, the second conductive member 103c is configured to electrically connect the second die 103 with a circuitry or conductive structure external to the second die 103. In some embodiments, the second conductive member 103c is electrically connected with the substrate conductive member 101c. In some embodiments, the second conductive member 103c is disposed on and bonded with the substrate conductive member 101c, such that the second die 103 is electrically connected to the substrate 101.

In some embodiments, a fourth interface 103e is disposed between the substrate conductive member 101c and the second conductive member 103c. In some embodiments, the fourth interface 103e is horizontally extended. In some embodiments, the fourth interface 103e is substantially parallel to the fifth surface 103a-1 and the sixth surface 103a-2 and is substantially orthogonal to the sidewall 103a-3 of the second die 103. In some embodiments, the second conductive member 103c includes conductive material such as gold, silver, copper, nickel, tungsten, aluminum, tin and/or alloys thereof.

In some embodiments, the second conductive member 103c includes a second land portion 103c-1 and a second via portion 103c-2 extended from and coupled with the second land portion 103c-1. In some embodiments, the second land portion 103c-1 is laterally extended within or over the second dielectric layer 103b. In some embodiments, the second via portion 103c-2 is vertically extended within the second dielectric layer 103b and passes through at least one layer of the second dielectric layer 103b. In some embodiments, the second land portion 103c-1 and the second via portion 103c-2 are stacked over each other. In some embodiments, the second land portion 103c-1 and the second via portion 103c-2 are stacked alternately.

In some embodiments, the second land portion 103c-1 is disposed over the second dielectric layer 103b. In some embodiments, the second land portion 103c-1 is at least partially exposed from the second dielectric layer 103b. In some embodiments, the second land portion 103c-1 is a bonding pad for receiving, bonding with or electrically connecting with a conductive structure or a circuitry. In some embodiments, the second land portion 103c-1 is disposed on and bonded with the substrate land portion 101c-1.

In some embodiments, the second die 103 includes a third dielectric layer 103f disposed on the second die substrate 103a and a third conductive member 103g surrounded by the third dielectric layer 103f. In some embodiments, the third dielectric layer 103f is disposed over or on the sixth surface 103a-2 of the second die 103. In some embodiments, the third dielectric layer 103f includes several layers of dielectric material stacking over each other. In some embodiments, the third dielectric layer 103f includes dielectric material such as silicon oxide, silicon nitride, undoped silicon glass or the like. In some embodiments, the third dielectric layer 103f includes polymeric material. In some embodiments, the second dielectric layer 103b includes polyimide (PI), polybenzoxazole (PBO) or the like.

In some embodiments, the third conductive member 103g is disposed within or over the third dielectric layer 103f. In some embodiments, the third conductive member 103g extends within the third dielectric layer 103f. In some embodiments, the third conductive member 103g extends through one or more layers of the third dielectric layer 103f. In some embodiments, the third conductive member 103g is configured to electrically connect the second die 103 with a circuitry or conductive structure external to the second die 103. In some embodiments, the third conductive member 103g includes conductive material such as gold, silver, copper, nickel, tungsten, aluminum, tin and/or alloys thereof.

In some embodiments, several vias 103h are extended within the second die 103. In some embodiments, the via 103h is extended through the second die substrate 103a. In some embodiments, the via 103h is extended between the second dielectric layer 103b and the third dielectric layer 103f. In some embodiments, the via 103h is electrically connected with and extended between the second conductive member 103c and the third conductive member 103g. In some embodiments, the substrate conductive member 101c is electrically connected with the third conductive member 103g through the via 103h and the second conductive member 103c. In some embodiments, the via 103h is surrounded by the second die substrate 103, the second dielectric layer 103b and the third dielectric layer 103f. In some embodiments, the via 103h is vertically extended within the second die 103. In some embodiments, the via 103h includes a conductive material such as copper, silver, gold, aluminum, etc. In some embodiments, the via 103h is a through substrate via or a through silicon via (TSV). In some embodiments, a distance D between two adjacent vias 103h is substantially less than or equal to 10 um. In some embodiments, the distance D is substantially less than 20 um.

In some embodiments, the molding 104 is disposed over or on the substrate 101. In some embodiments, the molding 104 surrounds the first die 102 and the second die 103. In some embodiments, the molding 104 is in contact with the fourth surface 102a-2 and the sidewall 102a-3 of the first die 102. In some embodiments, the molding 104 is in contact with the sidewall 103a-3 of the second die 103. In some embodiments, the molding 104 is disposed between the first die 102 and the second die 103. In some embodiments, the molding 104 is disposed on the substrate dielectric layer 101b. In some embodiments, the third dielectric layer is at least partially exposed from the molding 104. In some embodiments, the molding 104 can be a single layer film or a composite stack. In some embodiments, the molding 104 has a high thermal conductivity, a low moisture absorption rate and a high flexural strength. In some embodiments, the molding 104 includes various materials, such as molding compound, molding underfill, epoxy, resin, or the like. In some embodiments, the molding 104 includes oxide such as silicon oxide or the like.

In some embodiments, the interconnect structure 105 is disposed over or on the molding 104, the first die 102 and the second die 103. In some embodiments, the interconnect structure 105 is a redistribution layer (RDL) or a post passivation interconnect (PPI). In some embodiments, the interconnect structure 105 includes a fourth dielectric layer 105a and a fourth conductive member 105b.

In some embodiments, the fourth dielectric layer 105a is disposed over or on the molding 104, the first die 102 and the second die 103. In some embodiments, the fourth dielectric layer 105a is in contact with the molding 104 and the third dielectric layer 103f. In some embodiments, the molding 104 is disposed between the first die 102 and the fourth dielectric layer 105a. In some embodiments, the via 103h is disposed between the fourth dielectric layer 105a, and the substrate 101. In some embodiments, the via 103h is disposed between the fourth dielectric layer 105a and the substrate dielectric layer 101b. In some embodiments, the fourth dielectric layer 105a includes several layers of dielectric material stacking over each other. In some embodiments, the fourth dielectric layer 105a includes dielectric material such as silicon oxide, silicon nitride, undoped silicon glass or the like. In some embodiments, the fourth dielectric layer 105a includes polymeric material. In some embodiments, the fourth dielectric layer 105a includes polyimide (PI), polybenzoxazole (PBO) or the like.

In some embodiments, the fourth conductive member 105b is surrounded by the fourth dielectric layer 105a. In some embodiments, the fourth conductive member 105b is disposed within or over the fourth dielectric layer 105a. In some embodiments, the fourth conductive member 105b extends within the fourth dielectric layer 105a. In some embodiments, the fourth conductive member 105b extends through one or more layers of the fourth dielectric layer 105a. In some embodiments, the fourth conductive member 105b is configured to route a path of circuitry from the first die 102 or the second die 103 and redistribute I/O terminals of the first die 102 or the second die 103. In some embodiments, the fourth conductive member 105b is configured to electrically connect the substrate 101, the first die 102 or the second die 103 with a circuitry or conductive structure external to the substrate 101, the first die 102 or the second die 103. In some embodiments, the fourth conductive member 105b is electrically connected with the third conductive member 103g, the via 103h, the second conductive member 103c, the first conductive member 102c or the substrate conductive member 101c. In some embodiments, the fourth conductive member 105b is electrically connected and bonded with the third conductive member 103g or the via 103h. In some embodiments, the substrate 101 is electrically connected with the fourth conductive member 105b through the via 103h. In some embodiments, the first die 102 is electrically connected with the fourth conductive member 105b through the substrate 101 and the via 103h. In some embodiments, the fourth conductive member 105b includes conductive material such as gold, silver, copper, nickel, tungsten, aluminum, tin and/or alloys thereof.

In some embodiments, the fourth conductive member 105b includes a fourth land portion 105b-1 and a fourth via portion 105b-2 extended from and coupled with the fourth land portion 105b-1. In some embodiments, the fourth land portion 105b-1 is laterally extended within or over the fourth dielectric layer 105a. In some embodiments, the fourth via portion 105b-2 is vertically extended within the fourth dielectric layer 105a and passes through at least one layer of the fourth dielectric layer 105a. In some embodiments, the fourth land portion 105b-1 and the fourth via portion 105b-2 are stacked over each other. In some embodiments, the fourth land portion 105b-1 and the fourth via portion 105b-2 are stacked alternately.

In some embodiments, a bump pad 106 is disposed over or on the interconnect structure 105. In some embodiments, the bump pad 106 is disposed over and electrically connected with the fourth conductive member 105b. In some embodiments, the bump pad 106 is disposed over or surrounded by the fourth dielectric layer 105a. In some embodiments, the bump pad 106 is at least partially exposed from the fourth dielectric layer 105a. In some embodiments, the bump pad 106 is configured to receive a conductive member or the like. In some embodiments, the bump pad 106 is an under bump metallization (UBM) pad. In some embodiments, the bump pad 106 is electrically connected with the fourth conductive member 105b, the third conductive member 103g, the via 103h, the second conductive member 103c, the first conductive member 102c or the substrate conductive member 101c.

In some embodiments, the first conductive bump 107 is disposed over or on the interconnect structure 105. In some embodiments, the first conductive bump 107 is disposed over or on the fourth dielectric layer 105a and electrically connected with the fourth conductive member 105b. In some embodiments, the first conductive bump 107 is disposed on and bonded with the bump pad 106. In some embodiments, the first conductive bump 107 includes conductive material such as includes solder, copper, nickel, gold or etc. In some embodiments, the first conductive bump 107 is a solder ball, a ball grid array (BGA) ball, controlled collapse chip connection (C4) bump, a pillar or the like. In some embodiments, the first conductive bump 107 is in a spherical, hemispherical or cylindrical shape.

Figure 2:
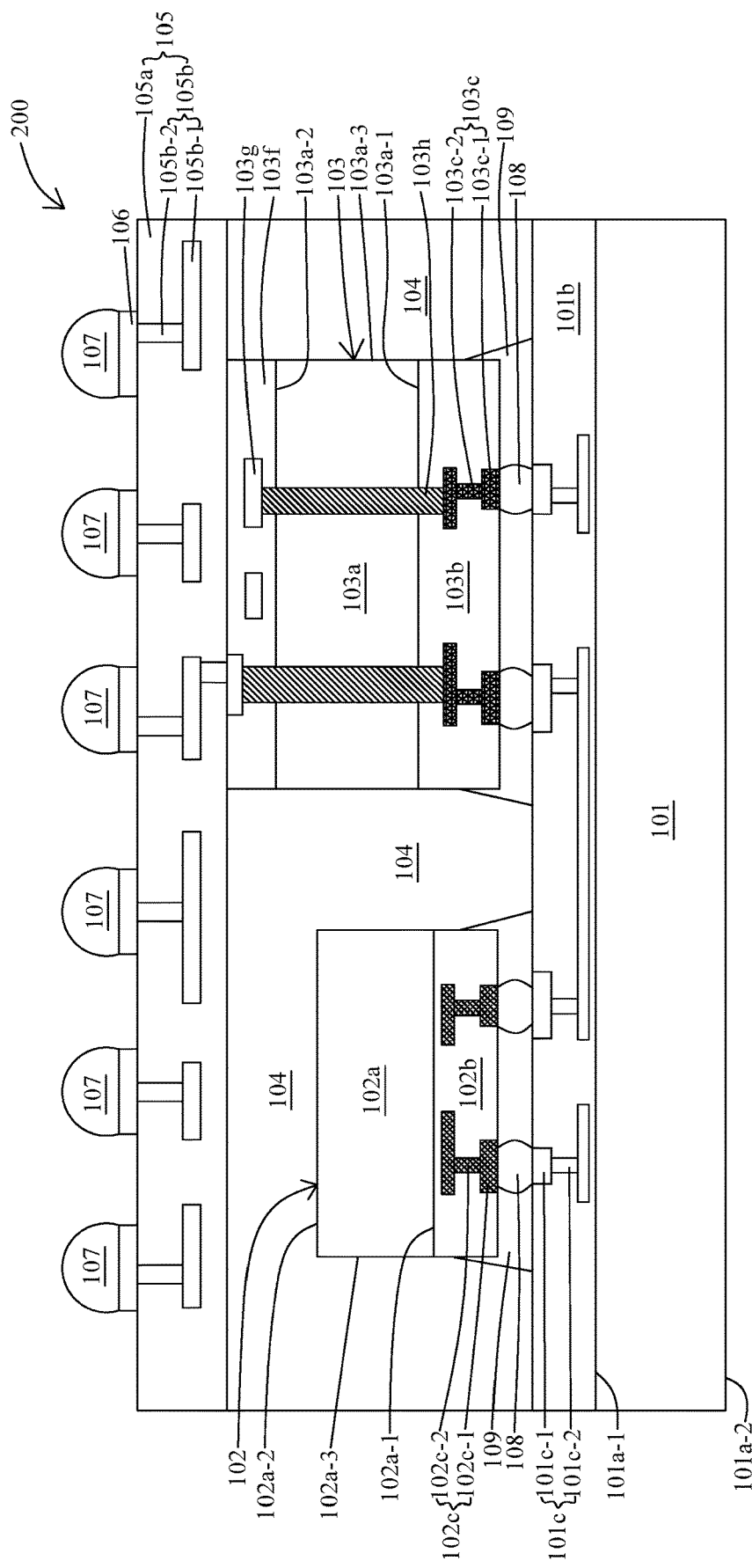
FIG. 2 is a schematic cross sectional view of a semiconductor structure in accordance with some embodiments of the present disclosure.

FIG. 2 is a schematic cross section view of a semiconductor structure 200 in accordance with various embodiments of the present disclosure. In some embodiments, the semiconductor structure 200 includes a substrate 101, a first die 102, a second die 103, a molding 104, an interconnect structure 105 and a first conductive bump 107, which have configurations similar to those described above or illustrated in FIG. 1.

In some embodiments, a second conductive bump 108 is disposed between the first die 102 and the substrate 101 or between the second die 103 and the substrate 101. In some embodiments, the second conductive bump 108 is disposed between the first conductive member 102c and the substrate conductive member 101c. In some embodiments, the second conductive bump 108 is disposed between the second conductive member 103c and the substrate conductive member 101c. In some embodiments, the first conductive member 102c and the substrate conductive member 101c are electrically connected by the second conductive bump 108. In some embodiments, the second conductive member 102c and the substrate conductive member 101c are electrically connected by the second conductive bump 108. In some embodiments, the first die 102 is electrically connected with the substrate 101 through the second conductive bump 108. In some embodiments, the second die 103 is electrically connected with the substrate 101 through the second conductive bump 108. In some embodiments, the second conductive bump 108 includes conductive material such as includes solder, copper, nickel, gold or etc. In some embodiments, the second conductive bump 108 is a microbump, a pillar or the like. In some embodiments, the second conductive bump 108 is in a spherical, hemispherical or cylindrical shape.

In some embodiments, the second conductive bump 108 is surrounded by an underfill material 109. In some embodiments, the underfill material 109 surrounds a portion of the first die 102 or a portion of the second die 103. In some embodiments, the underfill material 109 surrounds the first dielectric layer 102b or the second dielectric layer 103b. In some embodiments, the underfill material 109 is disposed over or on the substrate dielectric layer 101b. In some embodiments, the underfill material 109 fills spacing between two adjacent second conductive bumps 108. In some embodiments, the underfill material 109 is an electrically insulated adhesive for protecting the second conductive bump 108 or securing a bonding between the first die 102 and the substrate 101 or between the second die 103 and the substrate 101. In some embodiments, the underfill material 109 includes epoxy, resin, epoxy molding compounds or etc.

Figure 3:
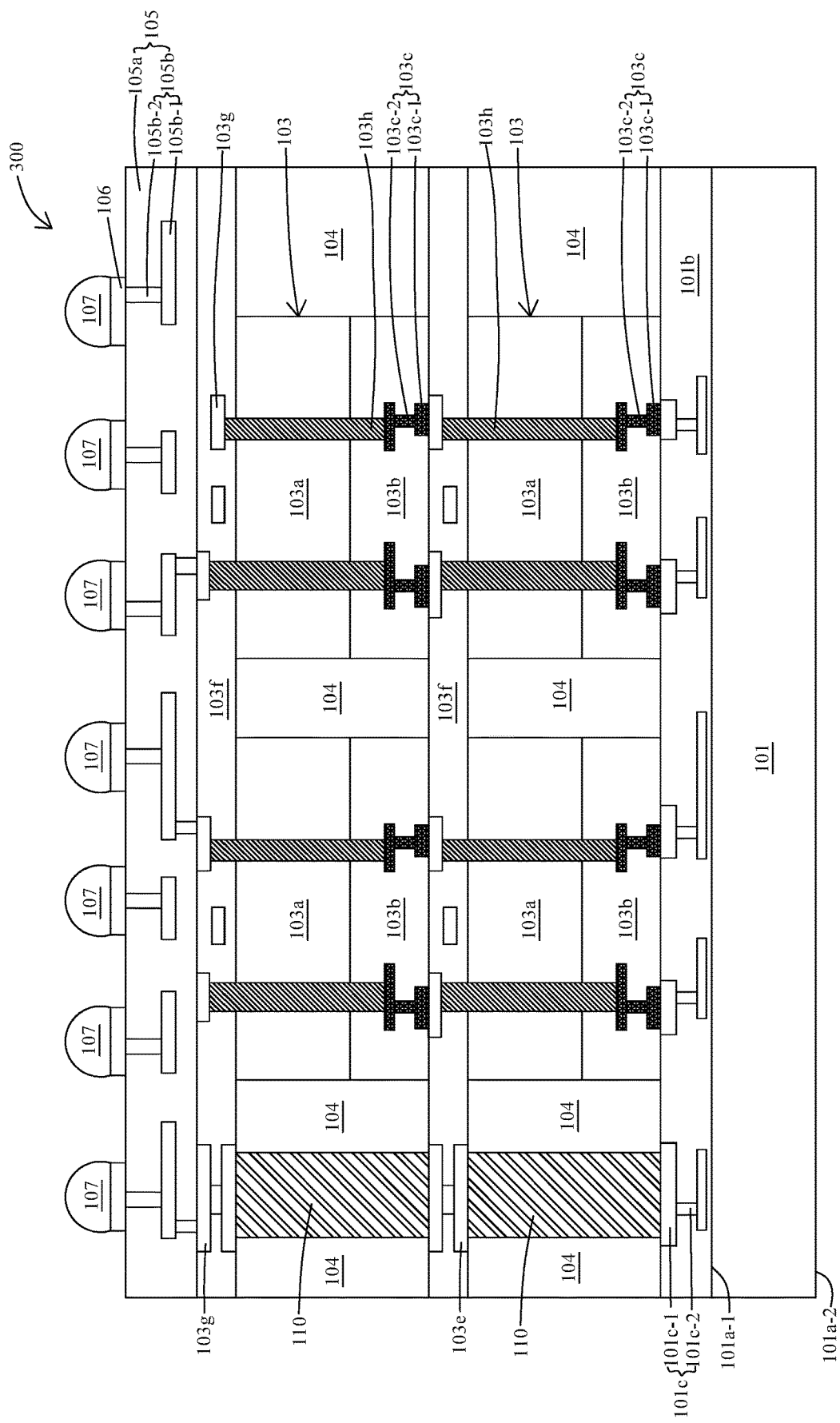
FIG. 3 is a schematic cross sectional view of a semiconductor structure in accordance with some embodiments of the present disclosure.

FIG. 3 is a schematic cross section view of a semiconductor structure 300 in accordance with various embodiments of the present disclosure. In some embodiments, the semiconductor structure 300 includes a substrate 101, a molding 104, an interconnect structure 105 and a first conductive bump 107, which have configurations similar to those described above or illustrated in FIG. 1 or 2.

In some embodiments, the semiconductor structure 300 includes several second dies 103a within the molding 104 and stacking over each other. In some embodiments, the second dies 103 are stacked over the substrate 101. In some embodiments, the second die 103 has configuration similar to the one described above or illustrated in FIG. 1 or 2. In some embodiments, the second dies 103 are electrically connected with each other by several vias 103h disposed within the second dies 103a. In some embodiments, the second dies 103 are electrically connected with the interconnect structure 105. In some embodiments, the second dies 103 are electrically connected with the fourth conductive member 105b by the vias 103h.

In some embodiments, a through dielectric via 110 is disposed and extended within the molding 104. In some embodiments, the through dielectric via 110 is a through molding via (TMV). In some embodiments, the through dielectric via 110 is extended through the molding 104. In some embodiments, the through dielectric via 110 is extended between the third dielectric layers 103f or between the third dielectric layer 103f and the substrate dielectric layer 101b. In some embodiments, the through dielectric via 110 is electrically connected with the interconnect structure 105 or the substrate 101. In some embodiments, the through dielectric via 110 is electrically connected with the fourth conductive member 105b or the substrate conductive member 101c. In some embodiments, the through dielectric via 110 is vertically extended through the molding 104. In some embodiments, the through dielectric via 110 includes a conductive material such as copper, silver, gold, aluminum, etc.

Figure 4:
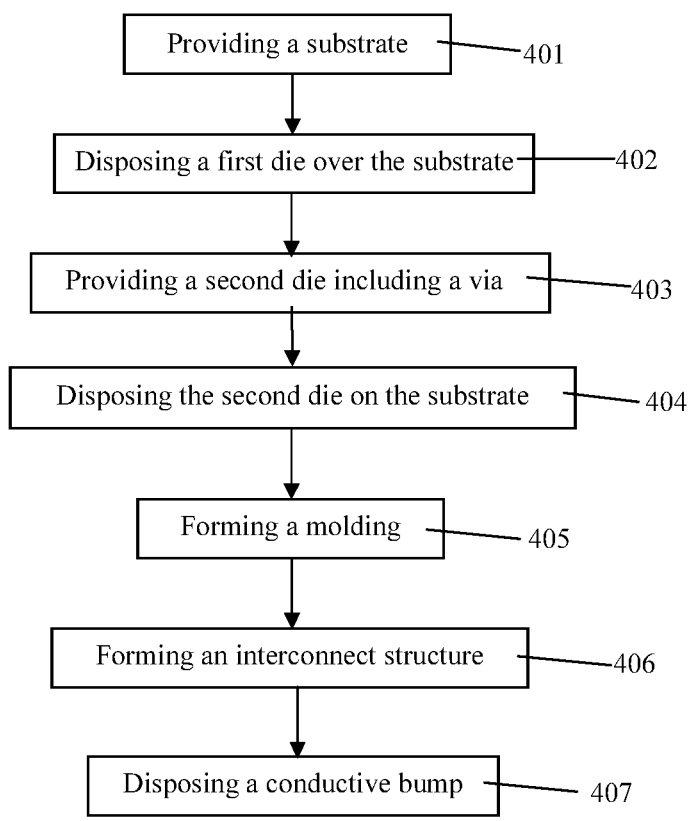
FIG. 4 is a flow diagram of a method of manufacturing a semiconductor structure in accordance with some embodiments of the present disclosure.

In the present disclosure, a method of manufacturing a semiconductor structure (100, 200, 300) is also disclosed. In some embodiments, the semiconductor structure (100, 200, 300) is formed by a method 400. The method 400 includes a number of operations and the description and illustration are not deemed as a limitation as the sequence of the operations. FIG. 4 is an embodiment of the method 400 of manufacturing the semiconductor structure (100, 200, 300). The method 400 includes a number of operations (401, 402, 403, 404, 405, 406 and 407).

Figure 5A:
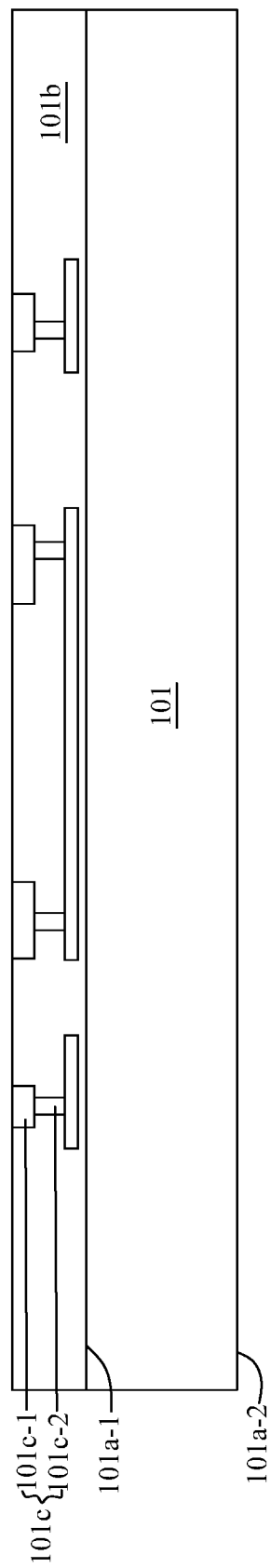

In operation 401, a substrate 101 is provided or received as shown in FIG. 5A. In some embodiments, the substrate 101 is a carrier, a wafer, an interposer or the like. In some embodiments, the substrate 101 is a silicon wafer or silicon interposer. In some embodiments, the substrate 101 includes a first surface 101a-1 and a second surface 101a-2 opposite to the first surface 101a-1.

In some embodiments, a substrate dielectric layer 101b is disposed over or on the substrate 101. In some embodiments, the substrate dielectric layer 101b is disposed over or on the first surface 101a-1 of the substrate 101. In some embodiments, the substrate dielectric layer 101b includes dielectric material such as silicon oxide, silicon nitride, undoped silicon glass or the like. In some embodiments, the substrate dielectric layer 101b includes polymeric material such as polyimide (PI), polybenzoxazole (PBO) or the like. In some embodiments, the substrate dielectric layer 101b is disposed by spin coating, chemical vapor deposition (CVD), plasma-enhanced CVD (PECVD), high-density plasma CVD (HDPCVD) or any other suitable operations.

In some embodiments, a substrate conductive member 101c is formed over or on the substrate 101 and surrounded by the substrate dielectric layer 101b. In some embodiments, the substrate conductive member 101c is at least partially exposed from the substrate dielectric layer 101b. In some embodiments, the substrate conductive member 101c includes conductive material such as gold, silver, copper, nickel, tungsten, aluminum, tin and/or alloys thereof. In some embodiments, the substrate conductive member 101c is formed by removing a portion of the substrate dielectric layer 101b to form an opening and then disposing a conductive material into the opening. In some embodiments, the removal of the portion of the substrate dielectric layer 101b includes photolithography, etching or any other suitable operations. In some embodiments, the disposing of the conductive material includes sputtering, electroplating or any other suitable operations. In some embodiments, the substrate 101, the substrate dielectric layer 101b and the substrate conductive member 101c have configurations similar to those described above or illustrated in any of FIGS. 1-3.

Figure 5B:
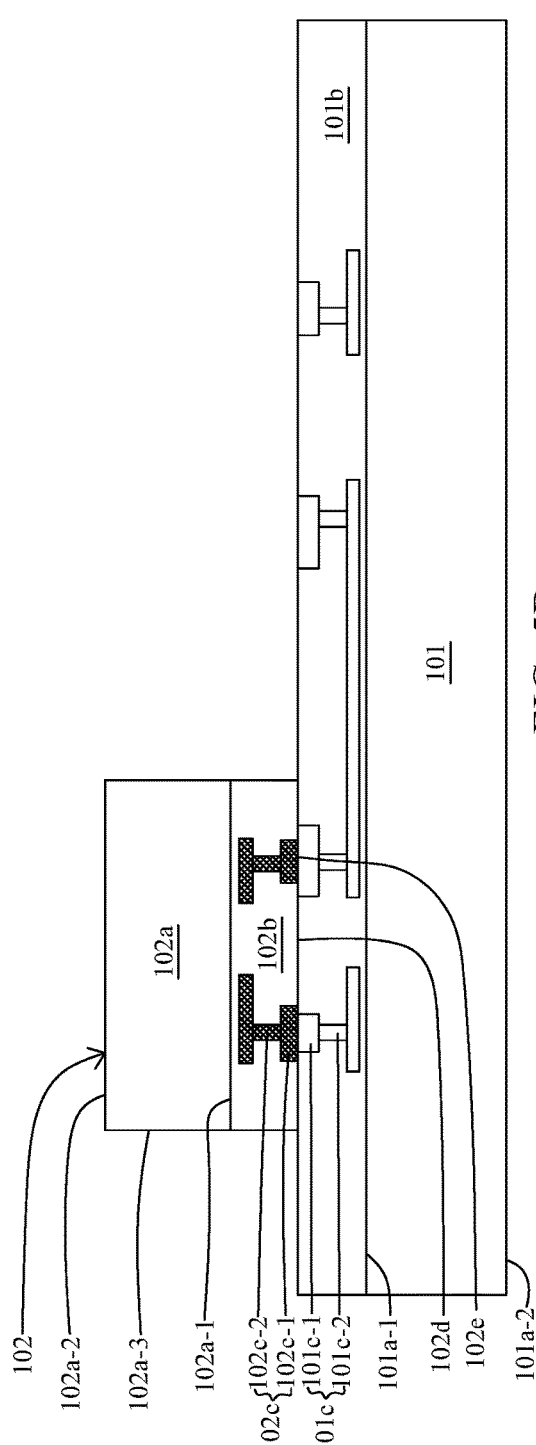
Figure 5C:
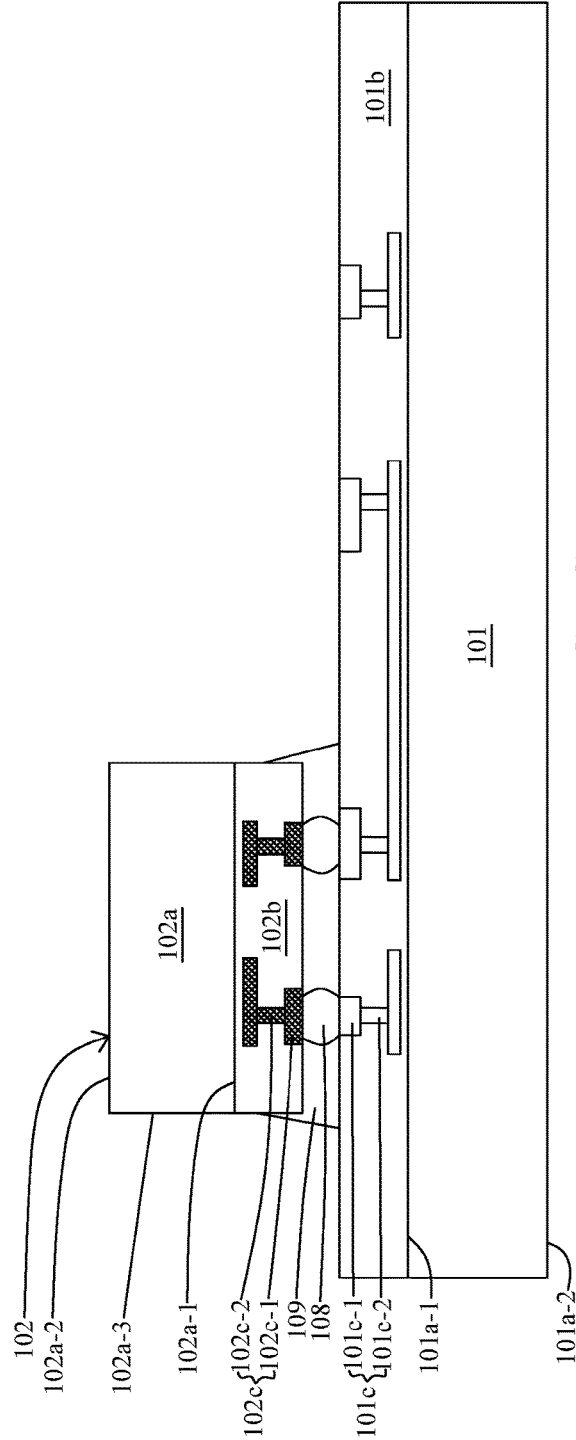

In operation 402, a first die 102 is provided or received, and is disposed over or on the substrate 101 as shown in FIGS. 5B and 5C. In some embodiments, the first die 102 is placed and bonded with the substrate 101. In some embodiments, the first die 102 is singulated from a semi conductive wafer. In some embodiments, the first die 102 comprises a variety of electrical circuits suitable for a particular application. In some embodiments, the electrical circuits include various devices such as transistors, capacitors, resistors, diodes and/or the like.

In some embodiments, the first die 102 includes a first die substrate 102a, a first dielectric layer 102b disposed between the first die substrate 102a and the substrate 101, and a first conductive member 102c surrounded by the first dielectric layer 102b. In some embodiments, the first die substrate 102a includes semiconductive materials such as silicon or other suitable materials. In some embodiments, the first die substrate 102a is a silicon substrate. In some embodiments, the first die substrate 102a includes a third surface 102a-1, a fourth surface 102a-2 opposite to the third surface 102a-1 and a sidewall 102a-3 substantially orthogonal to the third surface 102a-1 and the fourth surface 102a-2.

In some embodiments, the first dielectric layer 102b is disposed between the first die substrate 102a and the substrate 101. In some embodiments, the first dielectric layer 102b includes dielectric material such as silicon oxide, silicon nitride, undoped silicon glass or the like. In some embodiments, the first dielectric layer 102b includes polymeric material such as polyimide (PI), polybenzoxazole (PBO) or the like. In some embodiments, the first dielectric layer 102b is disposed by spin coating, chemical vapor deposition (CND), plasma-enhanced CVD (PECVD), high-density plasma CVD (HDPCVD) or any other suitable operations.

In some embodiments, the first dielectric layer 102b is bonded with the substrate dielectric layer 101b to form a first interface 102d between the substrate dielectric layer 101b and the first dielectric layer 102b. In some embodiments, the first dielectric layer 102b and the substrate dielectric layer 101b are bonded by hybrid bonding or any other suitable operations.

In some embodiments, the first conductive member 102c is formed over or surrounded by the first dielectric layer 102b. In some embodiments, the first conductive member 102c is at least partially exposed from the first dielectric layer 102b. In some embodiments, the first conductive member 102c includes conductive material such as gold, silver, copper, nickel, tungsten, aluminum, tin and/or alloys thereof. In some embodiments, the first conductive member 102c is formed by removing a portion of the first dielectric layer 102b to form an opening and then disposing a conductive material into the opening. In some embodiments, the removal of the portion of the first dielectric layer 102b includes photolithography, etching or any other suitable operations. In some embodiments, the disposing of the conductive material includes sputtering, electroplating or any other suitable operations.

In some embodiments, the first conductive member 102c is electrically connected and bonded with the substrate conductive member 101c. In some embodiments, the first conductive member 102c is bonded with the substrate conductive member 101c to form a second interface 102e between the substrate conductive member 101c and the first conductive member 102c. In some embodiments, the substrate conductive member 101c and the first conductive member 102c are bonded by hybrid bonding or any other suitable operations.

In some embodiments, the first die 102, the first die substrate 102a the first dielectric layer 102b and the first conductive member 102c have configurations similar to those described above or illustrated in any of FIGS. 1-3.

In some embodiments as shown in FIG. 5C, the first conductive member 102c and the substrate conductive member 101c bonded by a second conductive bump 108. In some embodiments, the second conductive bump 108 is disposed between the first conductive member 102c and the substrate conductive member 101c by ball dropping, solder pasting, stencil printing or any other suitable operations. In some embodiments, the second conductive bump 108 includes conductive material such as includes solder, copper, nickel, gold or etc. In some embodiments, the second conductive bump 108 is a microbump, a pillar or the like. In some embodiments, an underfill material 109 is disposed to surround the second conductive bump 108. In some embodiments, the underfill material 109 is disposed by flowing, injection or any other suitable operations.

Figure 5D:
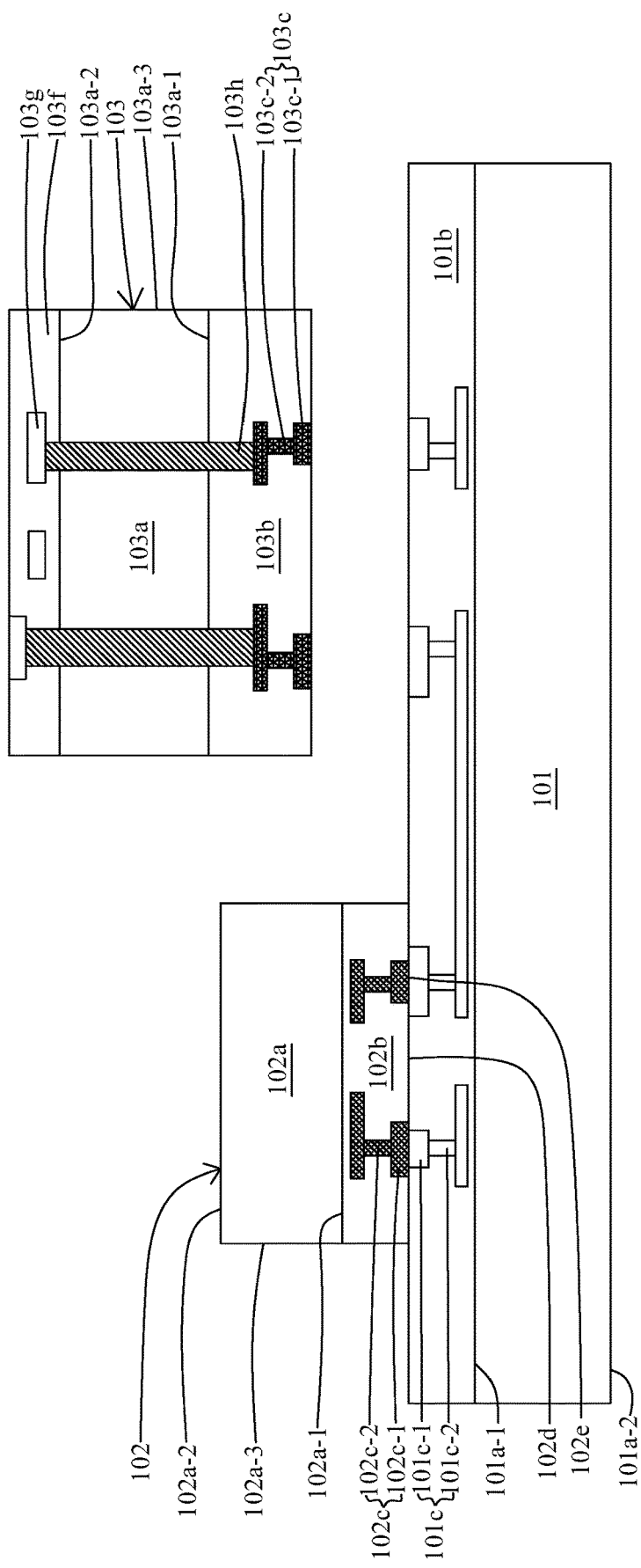

In operation 403, a second die 103 is provided or received as shown in FIG. 5D. In some embodiments, the second die 103 is singulated from a semiconductive wafer. In some embodiments, the second die 103 comprises a variety of electrical circuits suitable for a particular application. In some embodiments, the electrical circuits include various devices such as transistors, capacitors, resistors, diodes and/or the like.

In some embodiments, the second die 103 includes a second die substrate 103a, a second dielectric layer 103b disposed under the second die substrate 103a, and a second conductive member 103c surrounded by the second dielectric layer 103b. In some embodiments, the second die substrate 103a includes semiconductive materials such as silicon or other suitable materials. In some embodiments, the second die substrate 103a is a silicon substrate. In some embodiments, the second die substrate 103a includes a fifth surface 103a-1, a sixth surface 103a-2 opposite to the fifth surface 103a-1 and a sidewall 103a-3 substantially orthogonal to the fifth surface 103a-1 and the sixth surface 103a-2.

In some embodiments, the second dielectric layer 103b is disposed over or on the fifth surface 103a-1. In some embodiments, the second dielectric layer 103b includes dielectric material such as silicon oxide, silicon nitride, undoped silicon glass or the like. In some embodiments, the second dielectric layer 103b includes polymeric material such as polyimide (PI), polybenzoxazole (PBO) or the like. In some embodiments, the second dielectric layer 103b is disposed by spin coating, chemical vapor deposition (CVD), plasma-enhanced CVD (PECVD), high-density plasma CVD (HDPCVD) or any other suitable operations.

In some embodiments, the second conductive member 103c is formed over or surrounded by the second dielectric layer 103b. In some embodiments, the second conductive member 103c is at least partially exposed from the second dielectric layer 103b. In some embodiments, the second conductive member 103c includes conductive material such as gold, silver, copper, nickel, tungsten, aluminum, tin and/or alloys thereof. In some embodiments, the second conductive member 103c is formed by removing a portion of the second dielectric layer 103b to form an opening and then disposing a conductive material into the opening. In some embodiments, the removal of the portion of the second dielectric layer 103b includes photolithography, etching or any other suitable operations. In some embodiments, the disposing of the conductive material includes sputtering, electroplating or any other suitable operations.

In some embodiments, the second die 103 includes a third dielectric layer 103f disposed on the second die substrate 103a and a third conductive member 103g surrounded by the third dielectric layer 103f. In some embodiments, the third dielectric layer 103f is disposed over or on the sixth surface 103a-2 of the second die 103. In some embodiments, the third dielectric layer 103f includes dielectric material such as silicon oxide, silicon nitride, undoped silicon glass or the like. In some embodiments, the third dielectric layer 103f includes polymeric material such as polyimide (PI), polybenzoxazole (PBO) or the like. In some embodiments, the second dielectric layer 103b is disposed by spin coating, chemical vapor deposition (CVD), plasma-enhanced CVD (PECVD), high-density plasma CVD (HDPCVD) or any other suitable operations.

In some embodiments, the third conductive member 103g is formed over or surrounded by the third dielectric layer 103f. In some embodiments, the third conductive member 103g is at least partially exposed from the third dielectric layer 103f. In some embodiments, the third conductive member 103g includes conductive material such as gold, silver, copper, nickel, tungsten, aluminum, tin and/or alloys thereof. In some embodiments, the third conductive member 103g is formed by removing a portion of the third dielectric layer 103f to form an opening and then disposing a conductive material into the opening. In some embodiments, the removal of the portion of the third dielectric layer 103f includes photolithography, etching or any other suitable operations. In some embodiments, the disposing of the conductive material includes sputtering, electroplating or any other suitable operations.

In some embodiments, a via 103h is formed within the second die 103. In some embodiments, the via 103h is extended through the second die substrate 103a. In some embodiments, the via 103h is extended between the second dielectric layer 103b and the third dielectric layer 103f. In some embodiments, the via 103h is electrically connected with and extended between the second conductive member 103c and the third conductive member 103g. In some embodiments, the via 103h includes a conductive material such as copper, silver, gold, aluminum, etc. In some embodiments, the via 103h is a through substrate via or a through silicon via (TSV). In some embodiments, the via 103h is formed by removing a portion of the second die 103 to form a recess extended within the second die 103 and disposing a conductive material into the recess. In some embodiments, the via 103h is formed by removing a portion of the second die substrate 103a, the second dielectric layer 103b or the third dielectric layer 103f to form the recess and disposing the conductive material into the recess. In some embodiments, the removal of the portion of the second die 103 includes photolithography, etching or any other suitable operations. In some embodiments, the disposing of the conductive material includes sputtering, electroplating or any other suitable operations.

In operation 404, the second die 103 is disposed over or on the substrate 101 as shown in FIGS. 5E and 5F. In some embodiments, the second die 103 is bonded with the substrate 101. In some embodiments, the second dielectric layer 103b is bonded with the substrate dielectric layer 101b to form a third interface 103d between the substrate dielectric layer 101b and the second dielectric layer 103b. In some embodiments, the second dielectric layer 103b and the substrate dielectric layer 101b are bonded by hybrid bonding or any other suitable operations.

In some embodiments, the second conductive member 103c is electrically connected and bonded with the substrate conductive member 101c. In some embodiments, the second conductive member 103c is bonded with the substrate conductive member 101c to form a fourth interface 103e between the substrate conductive member 101c and the second conductive member 103c. In some embodiments, the substrate conductive member 101c and the second conductive member 103c are bonded by hybrid bonding or any other suitable operations.

In some embodiments, the second die 103, the second die substrate 103a, the second dielectric layer 103b, the second conductive member 103c, the third dielectric layer 103f and the third conductive member 103g have configurations similar to those described above or illustrated in any of FIGS. 1-3.

In some embodiments as shown in FIG. 5F, the second conductive member 103c and the substrate conductive member 101c bonded by the second conductive bump 108. In some embodiments, the second conductive bump 108 is disposed between the second conductive member 103c and the substrate conductive member 101c by ball dropping, solder pasting, stencil printing or any other suitable operations. In some embodiments, the second conductive bump 108 includes conductive material such as includes solder, copper, nickel, gold or etc. In some embodiments, the second conductive bump 108 is a microbump, a pillar or the like. In some embodiments, the underfill material 109 is disposed to surround the second conductive bump 108. In some embodiments, the underfill material 109 is disposed by flowing, injection or any other suitable operations.

In operation 405, a molding 104 is formed as shown in FIGS. 5G and 5H. In some embodiments, the molding 104 is formed over the substrate 101 and around the first die 102 and the second die 103. In some embodiments, the molding 104 is formed by disposing a molding material over the substrate 101 to cover the first die 102 and the second die 103 as shown in FIG. 5G, and then removing a portion of the molding material to expose at least a portion of the second die 103 as shown in FIG. 5H. In some embodiments, the molding material is disposed by transfer molding, injection molding, over molding or any other suitable operations. In some embodiments, the portion of the molding material is removed by grinding, etching or any other suitable operations. In some embodiments, the molding 104 is in contact with the fourth surface 102a-2 and the sidewall 102a-3 of the first die 102. In some embodiments, the molding 104 is in contact with the sidewall 103a-3 of the second die 103. In some embodiments, the first die 102 is entirely covered by the molding 104. In some embodiments, the second die 103 is at least partially exposed from the molding 104. In some embodiments, the third dielectric layer 103f is at least partially exposed from the molding 104. In some embodiments, the molding 104 is disposed over the first die 102a. In some embodiments, the molding 104 includes various materials, such as oxide, molding have configuration similar to the one described above or illustrated in any of FIGS. 1-3.

Figure 5I:
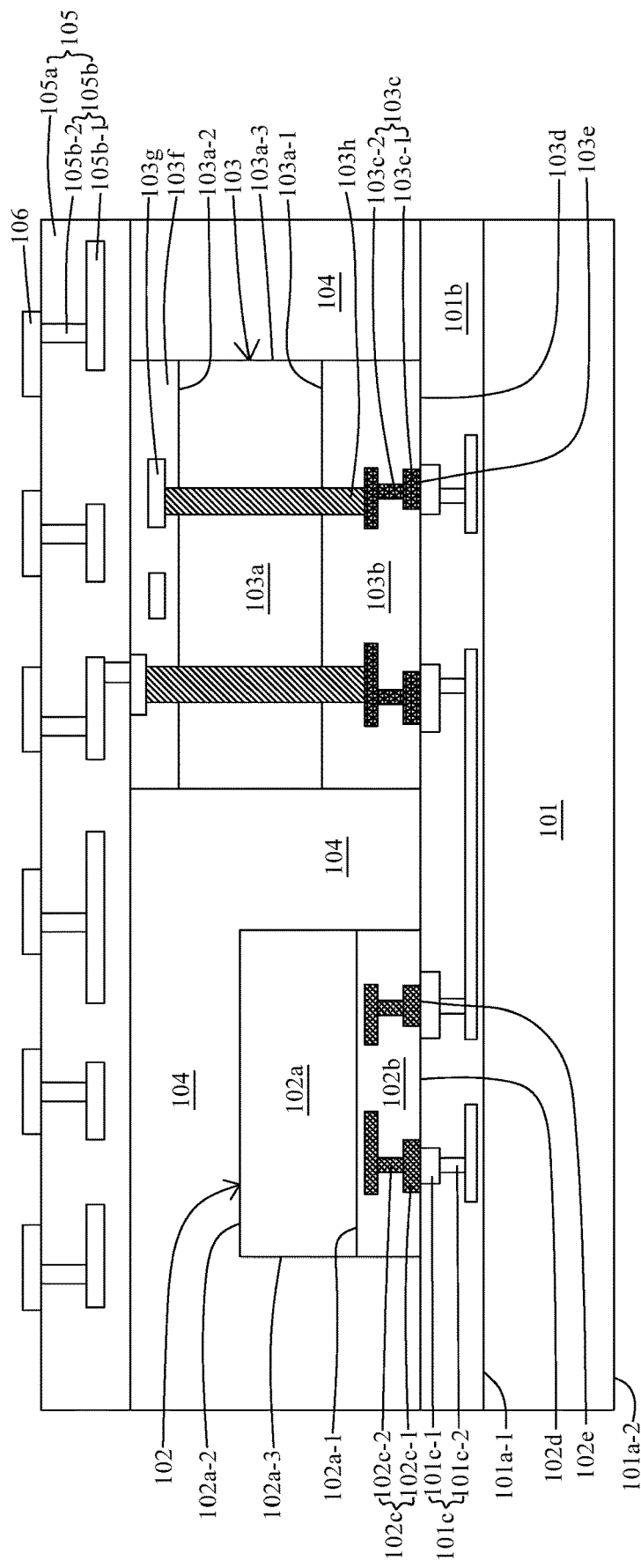

In operation 406, an interconnect structure 105 is formed as shown in FIG. 5I. In some embodiments, the interconnect structure 105 is formed over the molding 104, the first die 102a and the second die 103a. In some embodiments, the interconnect structure 105 is formed by disposing a fourth dielectric layer 105a over the molding 104 and the second die 103 and forming a fourth conductive member 105b surrounded by the fourth dielectric layer 105a. In some embodiments, the fourth conductive member 105b is formed over or within the fourth dielectric layer 105a.

In some embodiments, the fourth dielectric layer 105a includes dielectric material such as silicon oxide, silicon nitride, undoped silicon glass or the like. In some embodiments, the fourth dielectric layer 105a includes polymeric material such as polyimide (PI), polybenzoxazole (PBO) or the like. In some embodiments, the fourth dielectric layer 105a is disposed by spin coating, chemical vapor deposition (CVD), plasma-enhanced CVD (PECVD), high-density plasma CVD (HDPCVD) or any other suitable operations.

In some embodiments, the fourth conductive member 105b is formed over or surrounded by the fourth dielectric layer 105a. In some embodiments, the fourth conductive member 105b is at least partially exposed from the fourth dielectric layer 105a. In some embodiments, the fourth conductive member 105b includes conductive material such as gold, silver, copper, nickel, tungsten, aluminum, tin and/or alloys thereof. In some embodiments, the fourth conductive member 105b is formed by removing a portion of the fourth dielectric layer 105a to form an opening and then disposing a conductive material into the opening. In some embodiments, the removal of the portion of the fourth dielectric layer 105a includes photolithography, etching or any other suitable operations. In some embodiments, the disposing of the conductive material includes sputtering, electroplating or any other suitable operations. In some embodiments, the interconnect structure 105, the fourth dielectric layer 105a and the fourth conductive member 105b have configurations similar to the one described above or illustrated in any of FIGS. 1-3.

In some embodiments, a bump pad 106 is formed over or on the interconnect structure 105. In some embodiments, the bump pad 106 is formed over or surrounded by the fourth dielectric layer 105a. In some embodiments, the bump pad 106 is formed over and electrically connected with the fourth conductive member 105b. In some embodiments, the bump pad 106 is formed by evaporation, sputtering, electroplating or any other suitable operations. In some embodiments, the bump pad 106 has configuration similar to the one described above or illustrated in any of FIGS. 1-3.

Figure 5J:
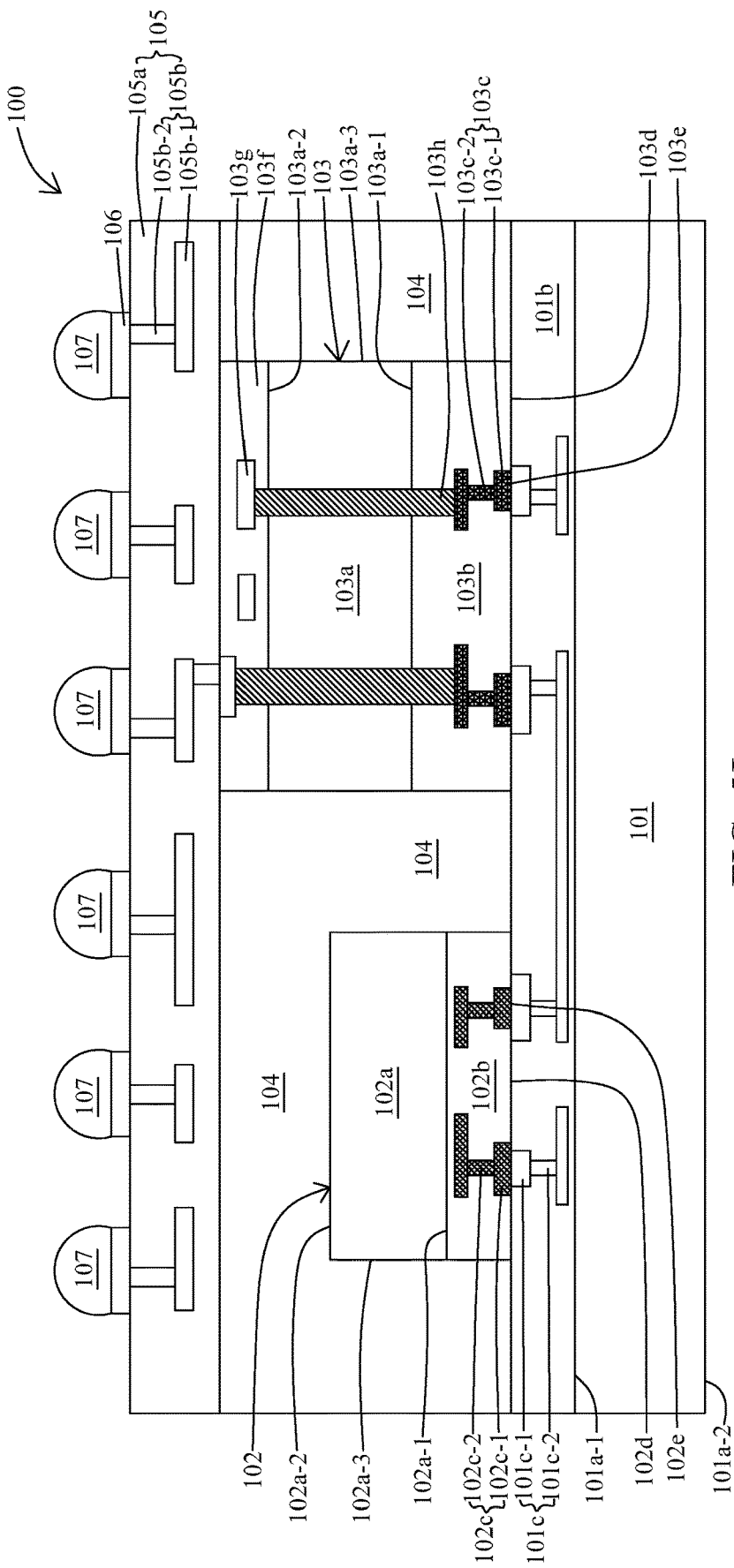

In operation 407, a first conductive bump 107 is disposed over the interconnect structure 105 as shown in FIG. 5J. In some embodiments, the first conductive bump 107 is disposed over and electrically connected with the fourth conductive member 105b. In some embodiments, the first conductive bump 107 is bonded with the bump pad 106. In some embodiments, the conductive bump 107 is disposed by ball dropping, solder pasting, stencil printing or any other suitable operations. In some embodiments, the conductive bump 107 is a solder joint, a solder bump, a solder ball, a ball grid array (BGA) ball, a controlled collapse chip connection (C4) bump or the like. In some embodiments, the conductive bump 107 is a conductive pillar or post. In some embodiments, the conductive bump 107 has configuration similar to the one described above or illustrated in any of FIGS. 1-3. In some embodiments, a semiconductor structure 100 as shown in FIG. 1 is formed.

Some embodiments of the present disclosure provide a method of manufacturing a semiconductor structure. The method includes following operations. A substrate is provided. A first die is disposed over the substrate. A second die is provided. The second die includes a via extended within the second die. The second die is disposed over the substrate molding is formed around the first die and second die. An interconnect structure is formed. The interconnect structure includes a dielectric layer and a conductive member. The dielectric layer is disposed over the molding, the first die and the second die. The conductive member is surrounded by the dielectric layer. The via is formed by removing a portion of the second die to form a recess extended within the second die and disposing a conductive material into the recess.

Some embodiments of the present disclosure provide a method of manufacturing a semiconductor structure. The method includes following operations. A substrate conductive member is formed over a substrate. A first die is disposed over the substrate conductive member. A second die is disposed over the substrate conductive member. The second die includes a die substrate, a first dielectric layer and a via. The via penetrates the die substrate, and a portion of the via is disposed in the first dielectric layer. A molding is formed around the first die and second die. An interconnect structure is formed over the molding, the first die and the second die. A conductive bump is formed over the interconnect structure.

Some embodiments of the present disclosure provide a method of manufacturing a semiconductor structure. The method includes following operations. A substrate is received. A first die is disposed over the substrate. A second die is disposed over the substrate. The second die includes a die substrate, a first dielectric layer over a first surface of the die substrate, a first conductive member in the first dielectric layer, a second dielectric layer over a second surface opposite to the first surface, a second conductive member in the second dielectric layer, and a via. The via penetrates the die substrate, a portion of the via is disposed in the first dielectric layer, and another portion of the via is disposed in the second dielectric layer. A molding is formed over the substrate and surrounds the first die and second die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
    providing a substrate;
    disposing a first die over the substrate;
    providing a second die including a via entirely disposed in the second die;
    disposing the second die over the substrate, wherein the first die and the second die are provided at a same level;
    forming a molding around the first die and the second die; and
    forming an interconnect structure including a dielectric layer and a conductive member, wherein the dielectric layer is disposed over the molding, the first die and the second die, and the conductive member is surrounded by the dielectric layer,
    wherein the via is formed by removing a portion of the second die to form a recess extended within the second die and disposing a conductive material into the recess.

2. The method of claim 1, wherein the removing of the portion of the second die includes etching operations, and the disposing of the conductive material includes electroplating or sputtering operations.

3. The method of claim 1, wherein the first die is entirely covered by the molding, and the second die is at least partially exposed from the molding.

4. The method of claim 1, wherein a bottom surface of the first die and a bottom surface of the second die are level.

5. A method of manufacturing a semiconductor structure, comprising:
    forming a substrate conductive member over a substrate;
    disposing first die over the substrate conductive member;
    disposing a second die over the substrate conductive member, wherein the second die comprises a die substrate, a first dielectric layer, a second dielectric layer and a via, the via is entirely disposed in the die substrate, the first dielectric layer and the second dielectric layer, and the second die is in direct contact with the substrate conductive member;

forming a molding around the first die and the second die;

forming an interconnect structure over the molding, the first die and the second die; and forming conductive bump over the interconnect structure.

6. The method of claim 5, wherein the first dielectric layer and the second dielectric layer are disposed over opposite surfaces of the die substrate.

7. The method of claim 5, wherein the second die further comprises a first conductive member disposed in the first dielectric layer, and a second conductive member disposed in the second dielectric layer.

8. The method of claim 7, wherein the first conductive member is electrically connected to the substrate conductive member, and the second conductive member is electrically connected to the interconnect structure.

9. The method of claim 7, wherein the via is coupled to the first conductive member and the second conductive member.

10. The method of claim 5, wherein the first die comprises a third dielectric layer and a third conductive member disposed in the third dielectric layer.

11. The method of claim 10, wherein the third conductive member is electrically connected to the substrate conductive member.

12. The method of claim 5, wherein the first die has a first surface facing the substrate and a second surface opposite to the first surface.

13. The method of claim 12, wherein the second surface of the first die is in contact with the molding.

14. The method of claim 12, wherein the first die has a sidewall surface coupling the first surface and the second surface, and the sidewall surface is in contact with the molding.

15. A method of manufacturing a semiconductor structure, comprising:

receiving substrate comprising a substrate conductive member;

disposing first die over the substrate;

disposing a second die over the substrate, wherein the second die comprises a die substrate, a first dielectric layer over a first surface of the die substrate, a first conductive member in the first dielectric layer, a second dielectric layer over a second surface opposite to the first surface, a second conductive member in the second dielectric layer, and a via, the via is entirely disposed in the die substrate, the first dielectric layer and the second dielectric layer, the via penetrates the die substrate, a portion of the via is disposed in the first dielectric layer, and another portion of the via is disposed in the second dielectric layer; and after disposing the second die, forming a molding over the substrate surrounding the first die and the second die.

16. The method of claim 15, wherein the via is coupled to the first conductive member and the second conductive member.

17. The method of claim 15, further comprising forming an interconnect structure over the molding, wherein the interconnect structure is electrically connected to the second conductive member.

18. The method of claim 17, further comprising forming a conductive bump over the interconnect structure.

19. The method of claim 15, wherein the first die comprises a third dielectric layer and a third conductive member disposed in the third dielectric layer.

20. The method of claim 15, wherein the first die has a first surface facing the substrate, a second surface opposite to the first surface, a sidewall surface coupling the first surface and the second surface, and the sidewall surface and the second surface of the first die are in contact with the molding.

* * * * *